United States Patent [19]
Dahringer et al.

[11] Patent Number: 5,365,656
[45] Date of Patent: Nov. 22, 1994

[54] SURFACE MOUNT ASSEMBLY OF DEVICES USING ADCON INTERCONNECTIONS

[75] Inventors: Donald W. Dahringer, Glen Ridge; Alan M. Lyons, New Providence, both of N.J.

[73] Assignee: AT&T Corp., Murray Hill, N.J.

[21] Appl. No.: 61,753

[22] Filed: May 14, 1993

Related U.S. Application Data

[63] Continuation-in-part of Ser. No. 755,704, Sep. 6, 1991, abandoned.

[51] Int. Cl.⁵ .............................................. H05K 3/30
[52] U.S. Cl. ...................................... 29/840; 29/841; 156/285; 156/382; 156/583.3
[58] Field of Search .................... 29/840, 832, 841; 156/285–287, 288, 276, 583.3, 382

[56] References Cited

U.S. PATENT DOCUMENTS

| | | |
|---|---|---|
| 2,960,147 | 11/1960 | Ferrell ..................... 156/583.3 X |
| 4,113,981 | 9/1978 | Fujita . |
| 4,667,401 | 5/1987 | Clements et al. . |
| 4,868,637 | 9/1989 | Clements et al. . |
| 5,108,532 | 4/1992 | Thein et al. ............... 156/583.3 X |

OTHER PUBLICATIONS

B. Sun, "'The Paste Connector'–Vertically Conductive Adhesive", *Connection Technology*, pp. 31–32 (1988).

*Primary Examiner*—Carl E. Hall
*Attorney, Agent, or Firm*—Oleg E. Alber

[57] ABSTRACT

A process of batch assembly of sundry leaded or padded devices, encapsulated and non-encapsulated, onto a printed wiring board (PWB), which exhibit significant improvements in both manufacturability and reliability. A pressure frame assembly apparatus permits an application of uniformly distributed pressures to a variety of leaded packages and padded semiconductor chips during cure of conductive adhesives (AdCons), and leads to the reduction of variations in initial interconnection resistance, and thereby to the enhancement of the reliability of AdCon interconnections. The pressures are applied to the devices by an external application of a fluid under pressure to a flexible, resiliently stretchable membrane which conformably envelops outlines of the devices and adjacent areas of the PWB. Application of vacuum suction to within the cavity, formed by the pressure frame and the membrane, prior to the external application of the fluid pressure to the membrane, further improving the reliability of surface mounted assembly of packages on the interconnection board. The external application of pressure enhances thermal conductivity needed for curing the AdCon, increases the range of processing parameters usable for this technique and reduces assembly times. Assembly yields approaching 100% were observed for a variety of surface mounted packages indicating that the system will be highly reliable.

29 Claims, 4 Drawing Sheets

SURFACE MOUNT ASSEMBLY OF DEVICES USING ADCON INTERCONNECTIONS

This application is a continuation-in-part of application Ser. No. 07/755,704, filed on Sep. 6, 1991 now abandoned.

FIELD OF THE INVENTION

This invention concerns process of surface mount assembly of devices using AdCon interconnections.

BACKGROUND OF THE INVENTION

Electrically conductive adhesives are widely used in the electronics industry. Important applications include die-attach and assembly of printed wiring boards (PWBs). An example of a device, 2, with a quad arrangement of leads, 3, surface mounted on a PWB, 4, to a corresponding plurality of conductor pads, 5, which, in turn, are connected to conductors, 6, on the PWB forming a part of a larger assembly, 1, is shown schematically in FIG. 1. As device dimensions continue to shrink, the numbers of leads on devices to be connected to the PWBs continue to increase and the distance between centers of adjacent leads or pads (known as a "pitch") continues to decrease, it becomes more difficult to accurately place isotropically conductive adhesives without shorting adjacent leads. An alternative approach is to use anisotropically conductive adhesives which conduct only in the direction perpendicular to the board (z-direction).

Anisotropically conductive adhesives, hereinafter called AdCons (for Adhesive Connectors), is a class of electrically conductive adhesive materials formulated on the "bridging" concept. The materials are prepared by dispersing electrically conductive particles in an insulating polymer matrix forming an adhesive composite. Typically, the adhesive composite is applied to the surface of a PWB by stencil printing, screen-printing or laminating a film of the conductive adhesive. A schematic representation of a portion of PWB, 4, with conductor pads 5, a region of AdCon, 7, on the PWB and a device 2 with leads 3 to be connected to the conductor pads, is shown in FIG. 2. After the device is placed onto the PWB and a placement force displaces the AdCon from between the conductor pads on the PWB substrate and the leads on the device, a layer of AdCon with a thickness of a single particle remains between each lead and conductor pad, as is shown schematically in FIG. 3. Individual particles span the gap between the device and PWB and form an electrical interconnection. Similarly, semiconductor chips with conductive pads may be surface mounted on the PWB.

In the past, the formation of AdCon interconnections was typically conducted via serial processes where each package was aligned, placed under pressure, and cured individually in a curing oven. Examples of such processing may be seen from U.S. Pat. No. 4,667,401 issued on May 26, 1987 and U.S. Pat. No. 4,868,637 issued on Sep. 19, 1989, both to James R. Clements et al. or from an article by Brian Sun "'The Paste Connector'—Vertically Conductive Adhesive", *Connection Technology*, August 1988, pp. 31–32. However, this type of processing leads to an inadequate control of applied pressure which could vary from insufficient with formation of non-conducting joints to excessive with resultant damage of leads and interconnections. These processes were difficult to implement both for high input/output (I/O) surface-mount packages and for very small chips, not only because of their low throughput, but also because the assembly processes require coplanarity of the PWB, the package, and an assembly implement. Non-planarity in the system can lead to problems with yield and reliability performance. Furthermore, very small semiconductor chips need an application of high forces per small areas, without the danger of damaging the chips. Therefore, there is a need for an efficient manner for overcoming the above-noted problems, including a need for a process of applying a pressure uniformly across a device or devices of differing dimensions and heights, as well as for an apparatus for implementing the process.

SUMMARY OF THE INVENTION

This invention is a process of batch assembly of sundry leaded or padded devices, encapsulated and non-encapsulated, onto an interconnection substrate, such as a printed wiring board (PWB), which exhibits significant improvements in both manufacturability and reliability. A pressure frame assembly apparatus permits an application of uniformly distributed pressures to a variety of leaded packages and padded semiconductor chips during cure of conductive adhesives (AdCons), and leads to the reduction of variations in initial interconnection resistance, and thereby to the enhancement of the reliability of AdCon interconnections. The pressures are applied to the devices by an external application of a fluid under pressure to a flexible, resiliently stretchable membrane which conformably envelops outlines of the devices and adjacent areas of the PWB. Application of vacuum suction to within the cavity, formed by the pressure frame and the membrane, prior to the external application of the fluid pressure to the membrane, further improving the reliability of surface mounted assembly of packages on the interconnection board. The external application of pressure enhances thermal conductivity needed for curing the AdCon, increases the range of processing parameters usable for this technique and reduces assembly times. Assembly yields approaching 100%, were observed for a variety of surface mounted packages indicating that the system will be highly reliable.

BRIEF DESCRIPTION OF THE DRAWINGS

FIG. 10 is a frontal schematic exploded view of a cross-section of a vacuum-pressure frame apparatus; and FIG. 11 is frontal schematic view of a cross-section of the vacuum-pressure frame apparatus of FIG. 10 shown in a closed operating position.

DETAILED DESCRIPTION

The assembly of electronic circuits with electrically anisotropic conductive adhesives (AdCons) versus the solder technology offers numerous advantages for the manufacture of PWBs as well as for the effect on the environment. Low temperatures required to cure the adhesives minimize damage, both thermal and physical, to packages and PWBs. Adhesive systems permit the assembly of fine pitch components without the formation of solder shorts or insufficients, and lead to a reduced cost assembly processing. Environmentally, anisotropically conductive adhesives eliminate the need for cleaning flux residues with environmentally harmful chemicals, such as chlorofluorocarbons (CFCs), and reduce worker exposures to lead from molten wave solder baths or reflow ovens.

Figure 1:
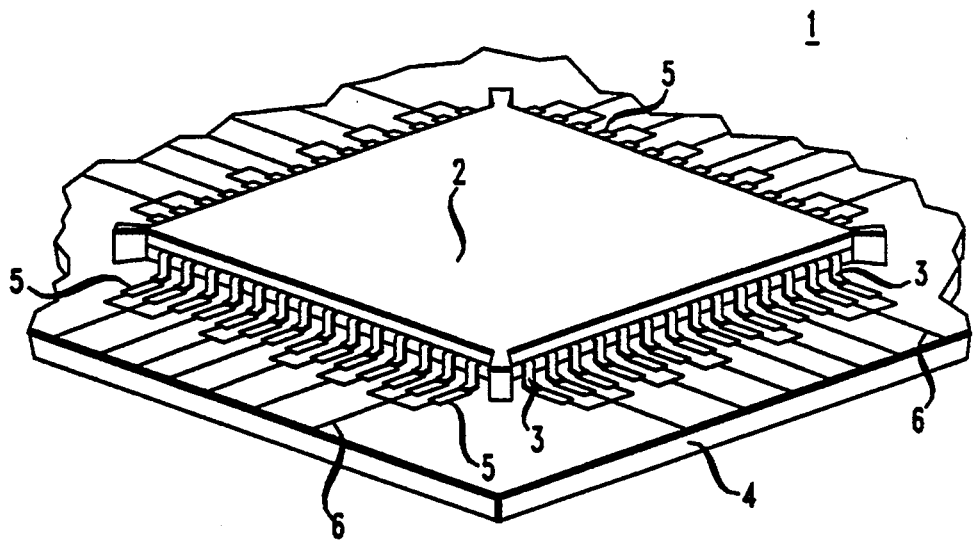
FIG. 1 is a schematic perspective representation of a portion of a PWB and of a quad device surface-mounted on the PWB.
Figure 2:
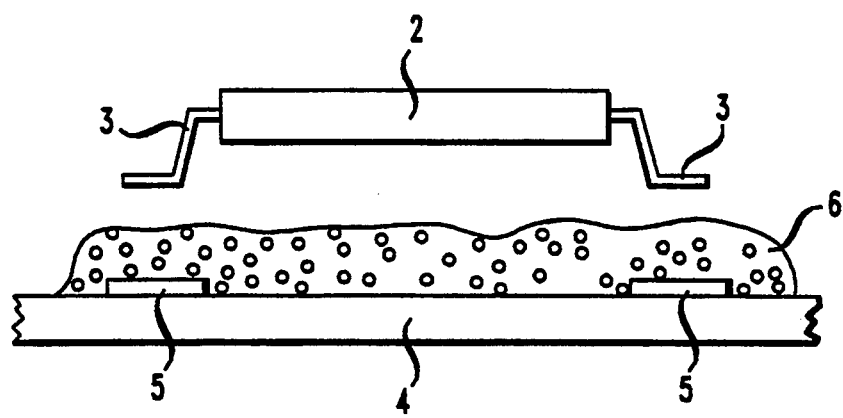
FIG. 2 is a schematic representation of a section of a PWB with a thin layer of AdCon thereon and a leaded conductive element prior to the assembly.
Figure 3:
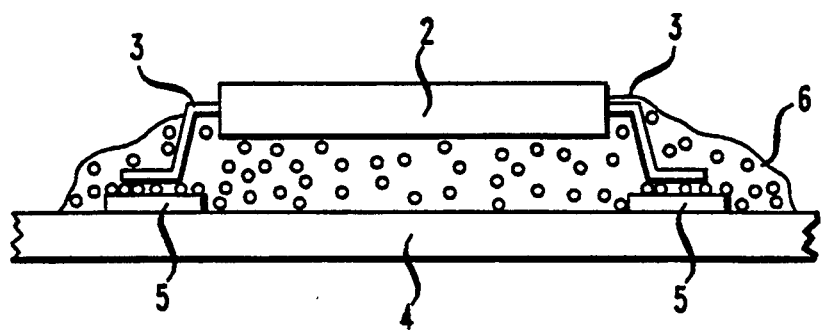
FIG. 3 is a schematic representation of the arrangement shown in FIG. 2 but with conductive elements (pads) on the PWB in electrical contact with leads of the device via conductive particles of the AdCon after an application of pressure.
Figure 4:
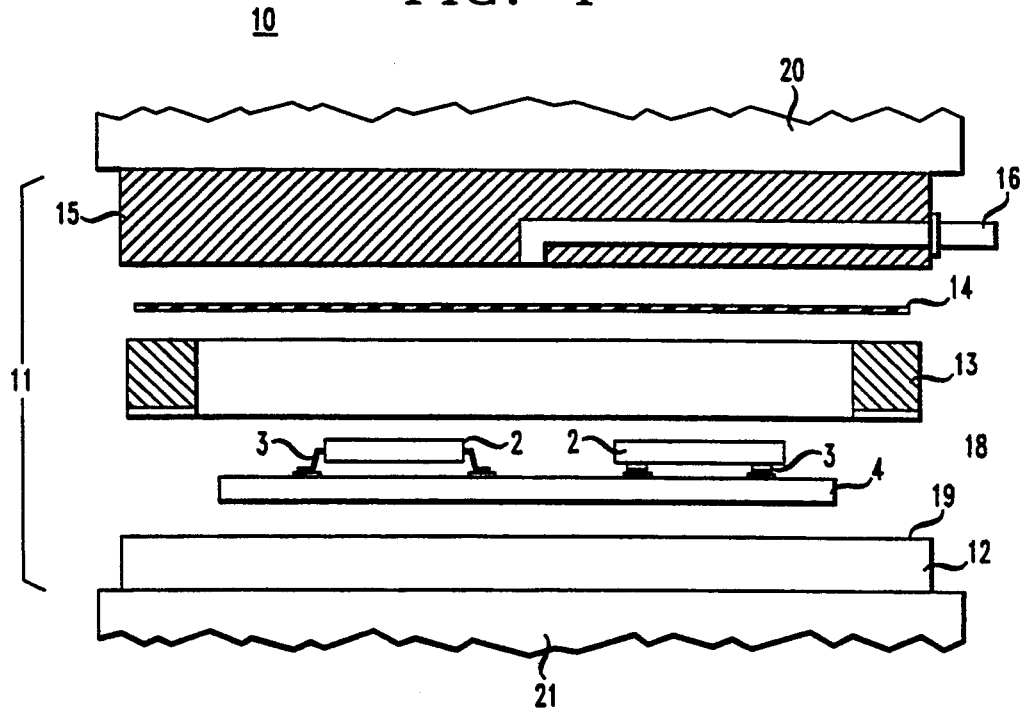
FIG. 4 is a frontal schematic exploded view of a cross-section of the pressure frame apparatus used for the batch assembly of AdCon interconnections.
Figure 5:
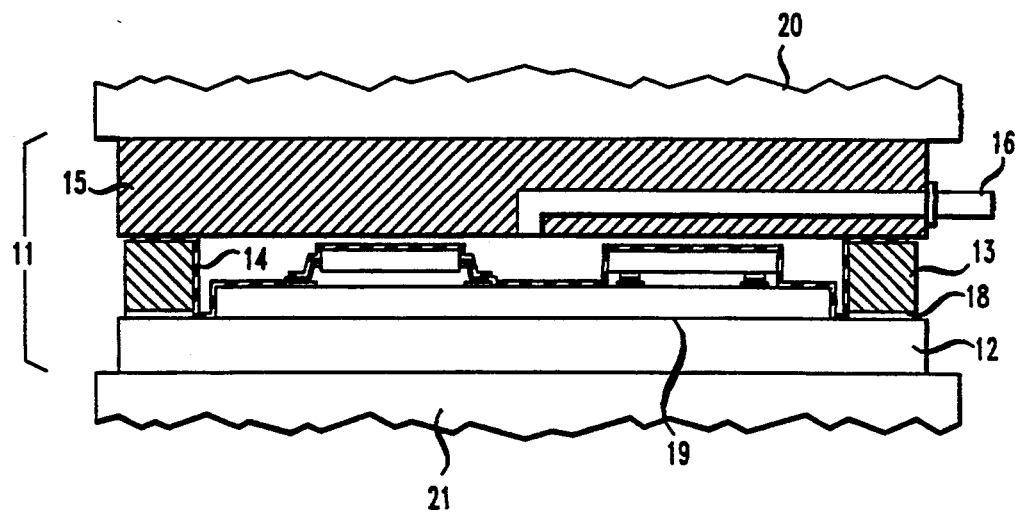
FIG. 5 is frontal schematic view of a cross-section of the pressure frame apparatus of FIG. 4 but shown in a closed, operating position.
Figure 6:
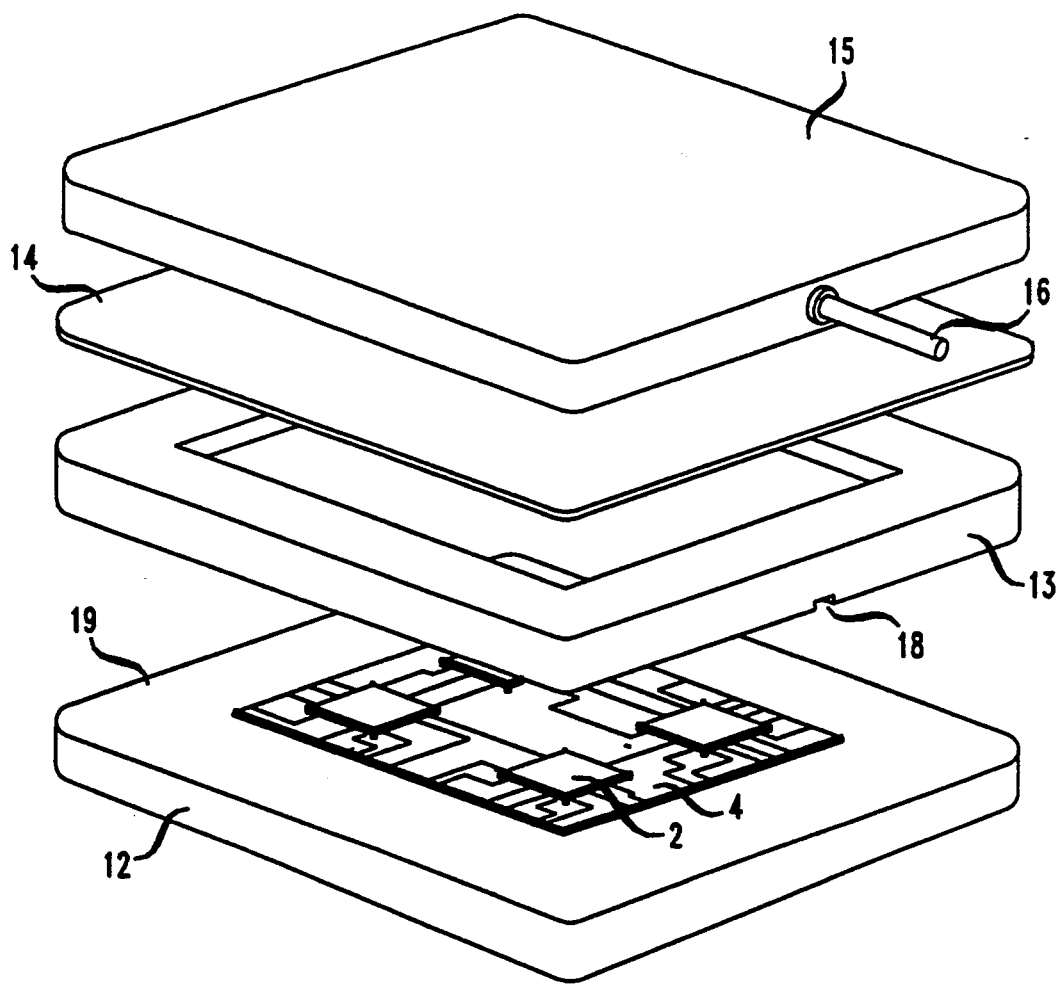
FIG. 6 is a schematic perspective exploded view of the apparatus shown in FIG. 4.
Figure 7:
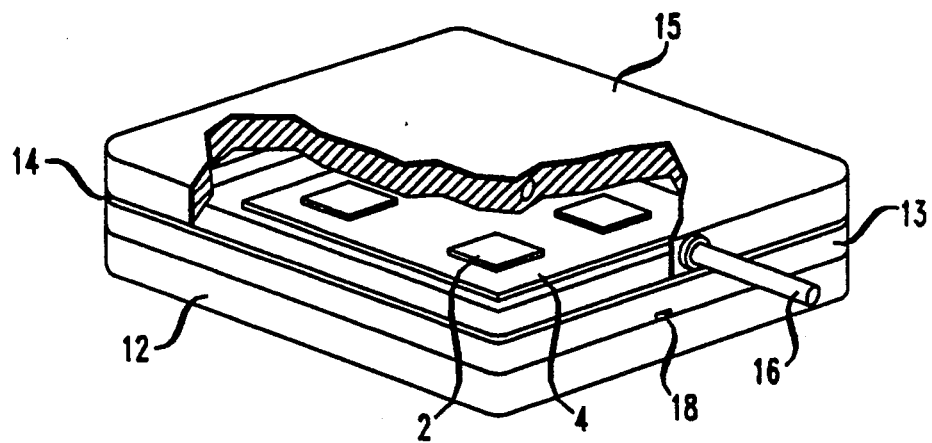
FIG. 7 is a schematic perspective view of the apparatus shown in FIG. 5.

An apparatus for practicing the invention is schematically represented in FIGS. 4 and 5. Corresponding perspective views of the apparatus are also shown in FIGS. 6 and 7, respectively. For reasons of clarity the elements of the apparatus and the devices are not drawn to scale. The apparatus, shown in an exploded view in FIG. 4 and generally denoted by numeral 11, includes a base, 12, a spacer, 13, a membrane, 14, and a lid, 15, provided with an inlet, 16, for introducing a suitable fluid, such as air, under pressure on top of cover 14. Membrane 14 is of flexible, resiliently stretchable material, such as polysiloxane rubber; secured at the periphery between the spacer and the lid. When subjected to pressure by introduction of fluid into the restricted volume, bounded by the membrane and the lid, the membrane compliably conforms to the outlines of the surfaces of devices, leads and adjacent surfaces of the PWB on the base 12. Care should be taken that the membrane, prior to the application of the pressure, evenly spans the space above the devices, preferably in a taut manner, without kinks and wrinkles which could affect the conformity of the cover with the PWB and devices. Spacer 13 is provided with at least one exhaust port 18, permitting expulsion of air from beneath cover 14. Spacer 13 is provided as a removable unit, primarily for the purposes of facilitating cleaning of floor, 19, of base 12. However, spacer 13 may be secured to base 12 either permanently or removably. A grid (not shown) may be provided, optionally, on or in the floor, 19 of base 12. The grid could be in the form of a screen or an array of rods on the floor or a grating formed in or on the floor of the base, and others. The main purpose of the grid is to reduce the possibility of presence of air pockets between the bottom of the PWB and the floor of the base, and to facilitate removal of the PWBs from the base after the application of pressure and heat.

Introduction of the fluid under pressure leads to a tendency for component parts of apparatus, 11, e.g. base 12 and lid 15, to separate each from another. Therefore, the apparatus should be provided with some means to keep the parts together. The apparatus may be held together by means of clamps or bolts or some other securing means. However, these may be cumbersome to use and assemble, and may present a danger of failure. A viable alternative could be the use of a simple press, such as a bookbinder's press, operable in a suitable manner, e.g. by means of a vertical screw or a lever. A more viable alternative would be the use of an industrial type of a press, such as a laminating press.

In the preferred embodiment, apparatus 11 is positionable between an upper and a lower platens 20 and 21, respectively, of a typical laminating press (not shown). The pressure exhibited by the press by the press transversely of the apparatus should be sufficient to keep parts of the apparatus together and to prevent leakage of the fluid between the membrane and the lid, but not so great as to damage portions of membrane 14 located between adjacent portions of the spacer and the lid. Base 12, spacer 13 and the flexible membrane 14 are removable from the press for the purposes of placing on the base articles to be processed and removing the processed articles. Lid 15 may be also removable from the press along with the rest of the apparatus. Alternatively, lid 15 may be secured to and shall be movable vertically with upper platen 20 of the press. Also, base 12 may be secured to lower platen 21. In the preferred embodiment, spacer 13 is removable from base 12; however, spacer 13 may be secured on the base. Alternatively, spacer 13 may be attached to upper platen 20 and may be moved vertically with the lid. In the latter instance, arrangements should be made for securing membrane 14 between the spacer and the lid or for being capable of replacing the membrane as needed. This could necessitate attachment of spacer 13 removably to the lid.

The size of apparatus 11 may be sufficient to accommodate only one PWB. Alternatively, it may be of a size capable of accommodating several PWBs or PWB sheets which are each a multiple of several standard PWB's in size, and may be limited only by the size of the laminating press.

In operation, an assembly of a PWB, AdCon on the contact pads of the PWB, and at least one device (or semiconductor chip) with leads (or pads) in contact with the AdCon is placed onto floor 19 of base 12, spacer 13 is placed onto the peripheral section of base 12, membrane 14 is placed onto the spacer 13 enclosing a cavity formed by the base and the spacer, and lid 15 is placed over the membrane 14 securing the peripheral area of the membrane between the spacer and the lid. Thereafter apparatus 11 is placed onto lower platen 21, and the press is activated to bring platen 20 in contact with the lid. A suitable fluid, such as air, under pressure is introduced on top of membrane 14 via inlet 16, forcing cover 14 in conforming contact with the device or devices and with exposed upper surface of the PWB and of base 12. The pressure is preselected to force the devices toward the PWB so as to displace an excess of the adhesive from between contacting surfaces of the leads or pads 3 on the devices and pads 5 on the PWB leaving a thin adhesive layer in a thickness of a single particle, with particles in the adhesive layer forming an electrical connection between the contacting surfaces. However, the pressure should not be so excessive as to cause any damage to the device, e.g. to flatten, bend or even break off the leads.

The fluid is applied onto membrane 14 via inlet 16 connected to a suitable source (not shown) of pressurized fluid, e.g. air, forcing the membrane toward the PWB and devices thereon. The pressure exerted by the membrane onto the devices should only be sufficient to bring the leads (or pads) in contact with the metal particles in the AdCon so as to establish continuous conductive paths between the leads (or pads) of the device and the metallizations on the PWB without causing any damage to the assembly. Commercially available air compressor capable of providing pressure required for the bonding purpose, would be useful as the source of air pressure. A fluid pressure within a range of from 5 to 500 psi could be applied to the membrane. The actual pressure acting on the devices via the membrane is somewhat greater than the applied pressure being a combination of the pressure due to the applied pressure and due to forces exhibited by stretching of the membrane. Typically fluid pressures ranging from 5 and 25 psi, preferably 15 psi, are sufficient for most of IC package applications. An exception could be extremely small packages, such as non-encapsulated semiconductor chips, e.g. ⅛th an inch square or smaller, which may require application of higher pressures e.g. of the order of 200–300 psi.

In an exemplary embodiment, the polymer matrix for the AdCon used for these experiments was prepared from diglycidyl ether of bisphenol F (Dainippon Ink and Chemical Co., Epiclon 830 ®). A fumed silica thixotrope (Cabot, TS-720) was dispersed in the epoxy resin with a Waring ® blender at a concentration of 5 parts per hundred resin (phr). Thixotrope concentrations ranging from 1 to 10 parts per hundred resin may be useful. To aliquots of this mixture, 10 phr of a 2-ethyl,4-methylimidazole curing agent (Pacific Anchor Chemical, EMI-24) was added along with conductive particles. For the successful implementation of AdCon, the concentration of metal particles must be controlled such that a sufficient number of particles is present in the adhesive composite to assure reliable electrical conductivity between the PWB and the leads or pads of the device (z-direction), while electrical isolation is maintained between adjacent conductor pads and leads (x-y direction). Actually, one should strive for such required volume concentration of metallic particles in the adhesive composite which will provide a maximum amount of conductive particles without causing any shorts between adjacent leads 3 or adjacent conductor pads 5. In addition, adequate adhesive performance is necessary to maintain a mechanically robust interconnection. The formulations were mixed by hand and degassed under vacuum (15 micrometers of Hg) for 30 minutes before use. In the exemplary embodiment, the particles were silver plated glass spheres from 8 to 20 $\mu$m in size with an average diameter of 14 $\mu$m (obtainable from Potters Industries). They were added in an amount of from 10 to 15 volume % (26 to 32 wt. %), preferably 12.5 volume % (29 wt. %).

Assembly of packages on test PWBs was achieved by following a multistep process. The AdCon was mixed, degassed and stenciled onto a PWB in a thickness of about 2 mils using a doctor blade and shims or in a thickness of about 5 mils by means of a manually operated stencil printer (Henry Mann AP-810). Some of the packages were placed onto the stenciled PWBs manually and some using an appropriate tool (e.g. Manix or a Single Site Solder Machine or [SSSM]). Assembled boards were placed into apparatus 11 which was then placed between platens 20 and 21 where the adhesive interconnection was cured under heat and pressure as illustrated in FIG. 5.

The PWB is heated primarily from the bottom of base 12 at a temperature ranging from 100° to 350 ° C., preferably 125 ° C. Higher temperatures may be useful depending on the components, adhesive matrix formulations, and cure speed requirements. Heat may be supplied in a variety of ways, such as a) hot plates positioned between base 12 and lower platen, 21; b) heating coils imbedded in the base; or c) suitable heating means provided in the lower platen, e.g. heating coils, electrical, hot water or steam heating to provide heat within the desired range. Additional heating may be provided from the top of the apparatus in the manner similar to that for heating the bottom portion of the apparatus. However, the overhead heating need to be only a fraction of that needed for the bottom heating and is primarily to avoid cooling of base 12 and lower platen 21 by parts of the apparatus, e.g. lid 15 and upper platen 20, so as to avoid increase in the curing time. The overhead heating temperature may range from 30 to 350 degrees C., and is preferably 55° C. Alternatively, the heating arrangement may be reversed, with the higher preferred temperatures being applied from above and the lower from below apparatus 11.

Pressure is applied to the assembly on the base by means of flexible stretchable membrane 14 positioned over the cavity formed by base 12 and spacer 13. The pressure exerted by the fluid onto membrane 14 stretches the membrane and forces it into a conformable contact with the packages. The membrane should be sufficiently stretchable to conform under pressure about the individual package dimensions, thus insuring uniform pressure application in the direction normal to the PWB. The member should be of such resilient material as to permit the member to return to its original unstretched position upon removal of forces applied by the fluid. A wire screen, used as a grid separating the PWB from the heated base, prevents the membrane from sealing off access to exhaust port 18 in spacer 13. Cure times of from 30 seconds to 60 minutes, with 2 to 4 minutes being average, were used for each assembly curing operation.

The versatility of the above apparatus was tested using devices with a variety of leads or connections. These included 100 two-leaded discrete resistors, 12 14-leaded Small Outline Integrated Circuits (SOICs) with 50 mil pitch solder plated gull-wing leads, and 45 132-leaded daisy-chained Plastic Quad Flat Packages (PQFPs) with 25 mil pitch solder plated gull-wing leads (a total of 3,148 interconnections). PWBs used were fire resistant grade 4 (FR-4) boards made of glass fiber reinforced epoxy, clad with copper foil and coated with solder.

The resistors, SOICs and PQFPs, assembled and cured as described above, were tested for shorts and interconnections. Assembly yields of 100% of viable interconnections were observed for all packages. A viable interconnection was defined as one having a resistance value of <100 m$\Omega$ for two-leaded resistors and 14-leaded SOICs and <1$\Omega$ (including resistance contributions from the PWB and the internal package daisy chain) per each 16 leads for the 132-leaded PQFPs. No shorts were observed between any of the adjacent leads and pads.

The invention may be used for connection of a flexible flat cable (or cable pigtail) to conductors on a PWB.

Figure 8:
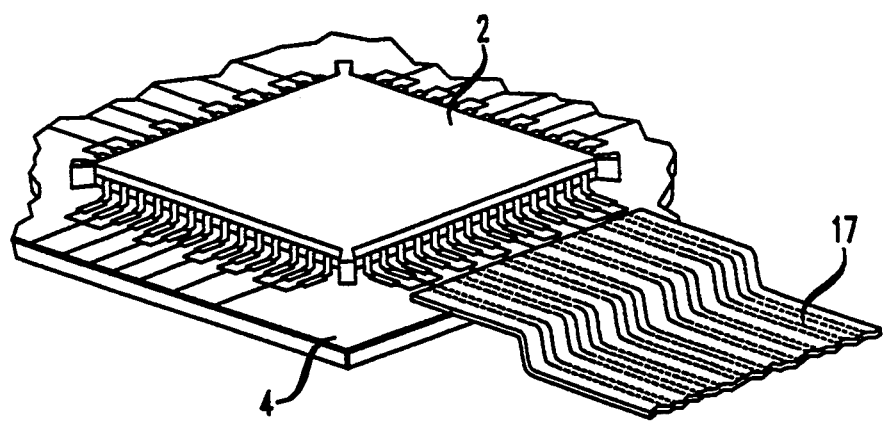
FIG. 8 is a schematic perspective representation of a portion of a PWB with a quad device surface mounted on the PWB and a cable pigtail connection to the device.
Figure 9:
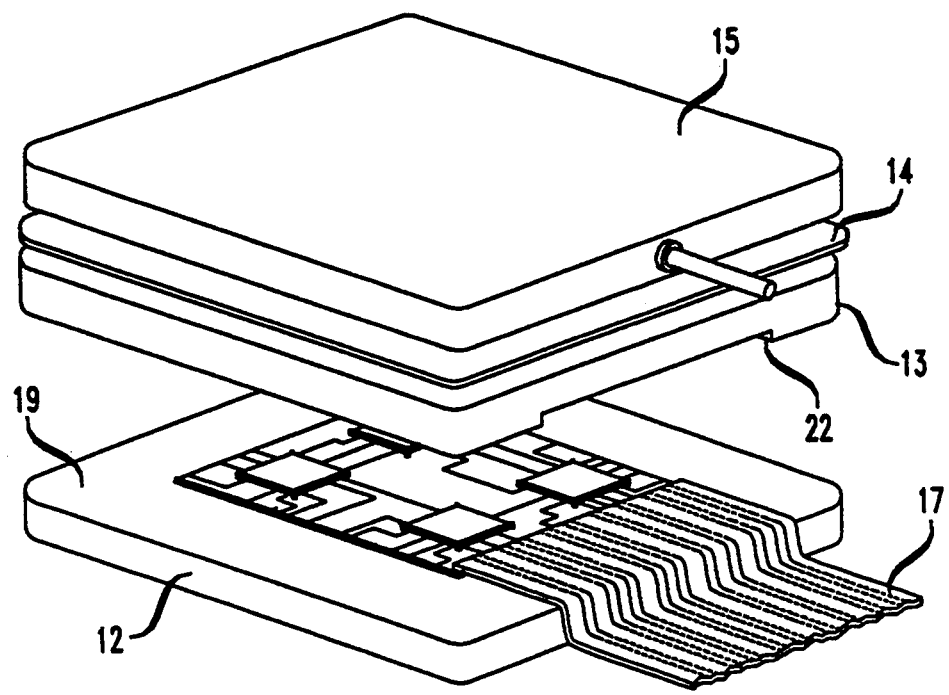
FIG. 9 is a schematic perspective view of the apparatus shown in FIG. 6 including a cable pigtail connection.

For example, as shown in FIGS. 8 and 9, an end portion of a flat cable, 17, provided with contacts (not shown) may be connected to conductors 6 on a PWB by means of AdCon deposited on the PWB. In FIG. 8 is shown such a connection to a single device, while in FIG. 9 the cable is connected to at least two devices. When the cable is of such length as to extend beyond the perimeter of apparatus 11, spacer 13 would be provided with an elongated aperture 22, in place of or in addition to exhaust ports 18, permitting the cable to extend through aperture 22 beyond apparatus 11.

In the above-described embodiment, device or devices are held in place by means of the resiliently deformable membrane conformably held against the devices by a fluid pressure applied on top of the membrane. However, with miniaturization, the devices are being reduced in size so that upon application of pressure to the membrane the devices may be dislodged by the membrane being forced against the device and the surface of the interconnection board. The danger of displacement would also arise if the devices would be of disproportionate variation in size and are closely positioned on the interconnection board.

This problem may be overcome by providing base 12 with at least one vacuum port, 23, and removal of the exhaust port 18 shown in FIG. 5. The use of vacuum would necessitate the use of the grid, 24, described above. This arrangement is shown in FIGS. 10 and 11. In operation, interconnection board 4 with adhesive and devices 2, is placed upon a grid, 24, within a cavity formed by base 12, spacer 13, membrane 14 and lid 15. After the cavity is enclosed with resilient membrane 14 and lid 15, a vacuum suction is applied via vacuum port 23 so as to bring membrane 14 in conformable contact with the device(s) and the interconnection board. The vacuum suction within the cavity is applied only sufficiently to bring the membrane gently in conformable contact with the device(s) without causing any displacement thereof. The vacuum suction is applied such that the air pressure within the cavity ranges from −1 to −14.7 psi. Thereafter, fluid pressure is applied on top of the membrane sufficiently to effect electrically conductive junction between contacts on the electronic device and contacts on the interconnection board.

Alternatively, the membrane may be composed of two webs of the resilient material. One, inner membrane facing the devices could by a thinner, more easily deformable membrane used for the purpose of conformably shaping about the devices with a minimum of applied suction, and the other upper membrane overlaying the inner membrane being deformable upon application of fluid under pressure.

We claim:

1. A process for mounting at least one electronic device having electrical contacts onto an interconnection substrate having electrical conductors so as to establish an electrical interconnection between said contacts and said conductors, which comprises:

applying an adhesive over a region on the interconnection substrate, said region including conductors to be electrically connected to contacts of said at least one device, forming an assembly of said at least one device and said interconnection substrate by placing said at least one device on the interconnection substrate such that the contacts of said at least one device are in alignment with the conductors in said region of the substrate, enclosing the assembly within a cavity provided with a resiliently stretchable membrane positioned above the assembly, applying fluid pressure to said membrane so as to stretch the membrane and force portions of the membrane into a conformable engagement with said at least one device and areas of the substrate at least adjacent to said at least one device, the membrane forcing the contacts of said at least one device toward the conductors of the substrate, and applying heat to said assembly such that said adhesive forms an electrical and mechanical interconnection between the contacts of the device and conductors of the substrate.

2. The method of claim 1 which said cavity is formed by a base, a spacer positioned on a peripheral portion of the base, said resiliently stretchable membrane positioned on the spacer such that the membrane is free of wrinkles and sags and is suspended above the level of said at least one electronic device, and a solid lid overlying the membrane and securing peripherally the membrane between the spacer and the peripheral region of the lid, said lid being provided with an inlet for introducing said fluid under pressure between the lid and the membrane so as to stretch the membrane and force portions of the membrane into said conformable contact with said at least one device.

3. The method of claim 1 in which said membrane comprises polysiloxane.

4. The method of claim 1, in which said fluid pressure is applied within a range of from 5 to 500 psi.

5. The method of claim 1, in which said pressure ranges from 5 to 25 psi.

6. The method of claim 1 in which curing of the adhesive is expedited by heating said assembly.

7. The method of claim 6, in which said heating is conducted by heating said assembly from the bottom at a temperature ranging from 100° to 350° C.

8. The method of claim 7, in which said bottom temperature is about 125° C.

9. The method of claim 6, in which said heating is conducted by additionally heating the assembly from above at a temperature ranging from 30° to 350° C.

10. The method of claim 9, in which said temperature from above is about 55° C.

11. The method of claim 1 in which the adhesive is selected from an anisotropically conductive adhesive material, an isotropically conductive adhesive material, and a nonconductive material.

12. The method of claim 1 in which said adhesive is selected from thermosetting, thermoplastic and pressure sensitive adhesives.

13. The method of claim 1 in which said interconnection substrate is a printed wiring board.

14. A process for mounting at least one electronic device having electrical contacts onto an interconnection substrate having electrical conductors so as to establish an electrical interconnection between said contacts and said conductors, which comprises:

forming an assembly of said at least one device and said interconnection substrate by applying an adhesive over a region on the interconnection substrate, said region including conductors to be electrically connected to contacts of said at least one device, placing said at least one device on the interconnection substrate such that the contacts of said device are in alignment with the conductors in said region of the substrate, enclosing the assembly within a cavity provided with a membrane positioned above the assembly, said membrane being resiliently stretchable so that, upon application of a vacuum within the cavity or a fluid pressure to the membrane, portions of the membrane engage said at least one device forcing the contacts of the device toward the conductors of the substrate, applying vacuum suction to a space within the cavity so as to draw the membrane toward and into an engaging contact with said at least one device, and applying heat and pressure to said at least one device such that said adhesive forms an electrical and mechanical interconnection between the contacts of the device and conductors of the substrate.

15. The method of claim 14 in which the said cavity is formed by a base, a spacer positioned on a peripheral portion of the base, a resiliently stretchable membrane positioned on the spacer and enclosing the cavity, said membrane is suspended above the level of said at least one electronic device and is free of wrinkles and sags, said base being provided with an outlet for providing vacuum suction from within the space defined by the cavity enclosed by the membrane, a solid lid overlying the membrane and securing peripherally the membrane between the spacer and the peripheral region of the lid, said lid being provided with an inlet for introducing a fluid under pressure between the lid and the membrane so as to stretch the membrane into a conformable contact with the said at least one device, and said vacuum outlet is used for reducing pressure within the cavity to cause the membrane to collapse against the said at least one device prior to the application of said fluid pressure to the membrane.

16. The method of claim 15, in which said membrane comprises polysiloxane.

17. The method of claim 14, in which the vacuum suction is applied before the pressure is applied between the membrane and the lid.

18. The method of claim 14, in which the vacuum suction within the cavity ranges from −1 to −14.7 psi.

19. The method of claim 14, in which said pressure is applied to the electronic device by introducing a fluid pressure above the membrane and forcing portions of said membrane toward the device.

20. The method of claim 15, in which said fluid pressure ranges from 5 to 500 psi.

21. The method of claim 14, in which said pressure ranges from 5 to 25 psi.

22. The method of claim 14, in which said curing of the adhesive is expedited by heating the assembly.

23. The method of claim 22, in which said heating is conducted by heating the assembly from the bottom at a temperature ranging from 100° to 350° C.

24. The method of claim 23, in which said bottom temperature is about 125° C.

25. The method of claim 22, in which said heating is conducted by additionally heating the assembly from above at a temperature ranging from 30° to 350° C.

26. The method of claim 25, in which said temperature from above is about 55° C.

27. The method of claim 14, in which the adhesive is selected from an anisotropically conductive adhesive material, an isotropically conductive adhesive material, and a nonconductive adhesive material.

28. The method of claim 14 in which the adhesive is selected from thermosetting, thermoplastic and pressure sensitive adhesives.

29. The method of claim 14 in which the interconnection substrate is a printed wiring board.

* * * * *

UNITED STATES PATENT AND TRADEMARK OFFICE
CERTIFICATE OF CORRECTION

PATENT NO. : 5,365,656
DATED : November 22, 1994
INVENTOR(S) : Donald William Dahringer
Alan Michael Lyons It is certified that error appears in the above-indentified patent and that said Letters Patent is hereby corrected as shown below:

On the Title Page:

: Abstract, "29 Claims, 4 Drawing Sheets, should read

In the Drawings:, --29 Claims 5 Drawing Sheets--

"Sheet 1 of 4" should read --Sheet 1 of 5--

"Sheet 2 of 4" should read --Sheet 2 of 5--

"Sheet 3 of 4" should read --Sheet 3 of 5--

"Sheet 4 of 4" should read --Sheet 4 of 5--

Provide Sheet 5 of 5 containing FIG. 10 and FIG. 11 and indicate --Sheet 5 of 5--

Signed and Sealed this

Twenty-first Day of February, 1995

*Attest:*

BRUCE LEHMAN

*Attesting Officer*     *Commissioner of Patents and Trademarks*